US011063165B2

(12) United States Patent
Buckley et al.

(10) Patent No.: US 11,063,165 B2
(45) Date of Patent: Jul. 13, 2021

(54) OPTOCOUPLER

(71) Applicant: Commissariat A L'Energie Atomique et aux Energies Alternatives, Paris (FR)

(72) Inventors: Julien Buckley, Grenoble (FR); Rene Escoffier, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 78 days.

(21) Appl. No.: 16/531,161

(22) Filed: Aug. 5, 2019

(65) Prior Publication Data

US 2020/0044104 A1     Feb. 6, 2020

(30) Foreign Application Priority Data

Aug. 6, 2018    (FR) ...................................... 18 57328

(51) Int. Cl.
| | |
|---|---|
| *H01S 5/183* | (2006.01) |
| *H01L 31/0475* | (2014.01) |
| *H01L 25/16* | (2006.01) |
| *H01L 31/173* | (2006.01) |
| *H01S 5/026* | (2006.01) |

(52) U.S. Cl.
CPC ........ *H01L 31/0475* (2014.12); *H01L 25/167* (2013.01); *H01L 31/173* (2013.01); *H01S 5/0264* (2013.01); *H01S 5/18302* (2013.01)

(58) Field of Classification Search
CPC combination set(s) only.
See application file for complete search history.

(56) References Cited

U.S. PATENT DOCUMENTS

| | | | |
|---|---|---|---|
| 4,996,577 A | 2/1991 | Kinzer | |
| 5,574,744 A * | 11/1996 | Gaw ................... | G02B 6/12004 257/E31.109 |
| 9,647,161 B2 | 5/2017 | Buckley et al. | |
| 2009/0121236 A1 | 5/2009 | Worley | |
| 2011/0157451 A1* | 6/2011 | Chang ................ | H04N 9/04559 348/336 |

(Continued)

FOREIGN PATENT DOCUMENTS

| | | |
|---|---|---|
| CN | 102005978 A | 4/2011 |
| WO | WO 2013/159693 A1 | 10/2013 |

OTHER PUBLICATIONS

French Preliminary Search Report dated Apr. 26, 2019 in French Application 18 57328, filed on Aug. 6, 2018 (with English translation of categories of cited documents).

*Primary Examiner* — Ratisha Mehta
(74) *Attorney, Agent, or Firm* — Oblon, McClelland, Maier & Neustadt, L.L.P.

(57) ABSTRACT

An optocoupler is provided, including at least one light source and at least one matrix of photovoltaic cells facing the at least one light source, the at least one light source being configured to receive, at an input, an input electrical signal, and to generate, at an output, according to the input electrical signal, a light signal, sent to the at least one matrix of photovoltaic cells, the at least one matrix of photovoltaic cells being configured to receive, at the input, at least partially the light signal and to deliver, at the output, at least one output electrical signal, at the level of at least two connection pads, and the at least one light source being a matrix of laser diodes.

20 Claims, 5 Drawing Sheets

(56) References Cited

U.S. PATENT DOCUMENTS

2013/0315533 A1* 11/2013 Tay .................. G02B 6/12
                                                    385/31
2019/0319149 A1* 10/2019 Nakano ............... H01L 31/054

* cited by examiner

OPTOCOUPLER

TECHNICAL FIELD OF THE INVENTION

The invention relates to electrical insulation devices and more specifically, optical couplers also called optocouplers. It has at least one particularly advantageous application in the field of power converters.

STATE OF THE ART

A power converter makes it possible to convert an electrical signal, for example a direct current DC, into another electrical signal, for example an alternate current AC.

Such a converter generally comprises a control circuit or controller and a driver.

The driver generally receives, at the input, an input signal coming from the controller. The driver is furthermore generally electrically supplied at the input by a supply.

In the case of a DC/AC converter, called inverter, the driver can generate, at the outlet, a command signal, sent to an inverter branch to command, for example, a switching of the switches of this inverter branch.

To convert electrical signals having voltages of a few hundred volts, an insulation at the input and/or at the output of the driver is very frequent.

This insulation makes it possible, on the one hand, to protect the driver, and on the other hand, to avoid disturbances of the reference of the command signal generated during switching.

The driver is generally insulated from the supply at the input by a galvanic insulation. This galvanic insulation has several disadvantages.

Indeed, it is voluminous and difficult to integrate.

Moreover, this galvanic insulation limits the intensity of the current of the input and/or output signals to a few milliamps. Such a galvanic insulation furthermore limits the frequency of the input and/or output signals to one hundred kilohertz. The inductance generated by this galvanic insulation can also induce distortions of the input and/or output signals.

This galvanic insulation, does not make it possible to obtain a total immunity of the power converter facing a magnetic field, typically for a magnetic field of 10 Gauss to 1 MHz.

The driver can be insulated from the controller by an optical coupling device called optocoupler.

Document U.S. Pat. No. 4,996,577 discloses an optocoupler comprising a light source coupled with photovoltaic cells stacked on one another and of which the edges are arranged facing the light source. The optocoupler makes it possible to transmit a low-power electrical signal, typically an electrical signal of ten volts and of a few microamps.

Such an optocoupler cannot however electrically insulate the driver from the supply.

An aim of the present invention is to overcome at least some of the disadvantages mentioned above.

According to a specific aspect, an aim of the present invention is to propose an optocoupler making it possible to transmit electrical signals having a power compatible with a supply of a converter driver.

Other aims, features and advantages of the present invention will appear upon examining the following description and the supporting drawings. It is understood that other advantages can be incorporated.

SUMMARY OF THE INVENTION

To achieve this aim, a first aspect of the invention relates to an optocoupler, comprising at least one light source, acting as an emitter, and at least one receiver facing the at least one light source. The at least one light source is configured to receive as an input an electrical input signal, and to generate, as an output, as a function of said input electrical signal, at least one light signal sent to the at least one receiver. The at least one receiver is configured to receive, as an input, at least part of said light signal and to deliver, as an output, at least one electrical output signal at three output connections arranged so as to form a middle point connection.

Advantageously, but in a non-limiting manner, the at least one light source is a matrix of laser diodes and the at least one receiver is a matrix of photovoltaic cells.

Advantageously, but in a non-limiting manner, the matrix of photovoltaic cells and the matrix of laser diodes mainly extend in parallel planes.

Such a middle point output configuration advantageously makes it possible to deliver the output electrical signal with a positive electrical voltage or with a negative electrical voltage, relative to the middle point. This middle point corresponds typically to a voltage reference, internal to the device. This voltage reference is therefore independent of the voltage reference of the input electrical signal.

The optocoupler can thus deliver an output electrical signal having a voltage of the same sign or of the sign opposite that of the input electrical signal. The versatility of the optocoupler is thus improved. This increases the number of options of driving a system comprising an upstream power source and a downstream device separated by such an optocoupler.

The upstream power source is that which delivers the input electrical signal, for example a supply of a converter driver.

The downstream device is that which receives the output electrical signal, for example a converter driver.

According to the invention and particularly advantageously, using laser diodes makes it possible to deliver the light signal with a power sufficient to transmit the electrical signals to supply to the at least one matrix of photovoltaic cells.

Such an optocoupler makes it possible, for example, to transmit electrical signals having a power of two magnitudes greater than that transmitted by the device of document U.S. Pat. No. 4,996,577.

Using laser diodes also makes it possible to transmit the input electrical signals of a lower power coming from the controller to the at least one matrix of photovoltaic cells.

Specifically, such an optocoupler can therefore be used to electrically supply a driver of a converter, or to transmit an input signal coming from a controller to the driver.

Using such an optocoupler advantageously makes it possible to remove the parasitic inductance linked to a galvanic insulation.

The electrical insulation of a driver can therefore advantageously be achieved by using such optocouplers.

Subsequently, the removal of the galvanic insulation and the replacement of it by such an optocoupler makes it possible for a high-frequency functioning, at least up to 10 megahertz, of the driver.

This also makes it possible to guarantee an increased immunity, even total immunity, of the connection between the driver and the inverter branch facing a magnetic field.

Such an optocoupler also has a limited volume and can therefore be easily integrated in the same casing as the driver.

Another aspect of the invention relates to an optocoupler system comprising a housing, a support, at least one chip assembled on said support, and at least one optocoupler according to the first aspect of the invention reported on said chip, the at least one optocoupler, the at least one chip and the support being situated in the housing.

According to a possibility, the system further comprises, in the same housing, an electronic circuit for driving a power converter connected as an input to a first optocoupler, and as an output to a second optocoupler.

The electronic driver can be advantageously reported on a chip common to the first and second optocouplers.

The volume of such a system is advantageously limited.

The invention proposed can advantageously be used for any application requiring a power converter. As non-limiting examples, electric vehicles can be equipped with at least one of the aspects of the invention; the switched-mode power supplies (regulation of the output voltage, AC/AC, AC/DC, DC/DC, DC/AC converters) can comprise at least one of the aspects of the invention; the transmission of insulated digital data or the controlling of power supply loads from a low-voltage accessible circuit can also comprise at least one of the aspects of the invention.

BRIEF DESCRIPTION OF THE FIGURES

The aims, objectives, as well as the features and advantages of the invention will best emerge from the detailed description of embodiments of the latter which are illustrated by the following supporting drawings, wherein.

Figure 1:
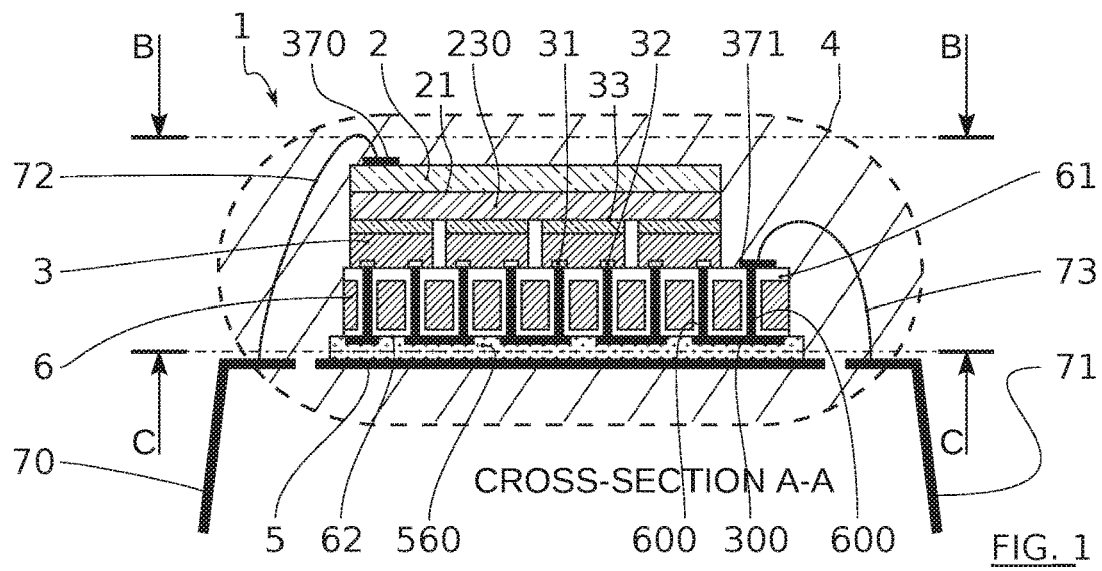
FIG. 1 shows, transversally cross-sectionally, an optocoupler system according to an embodiment of the present invention.

The drawings are given as examples and are not limiting of the invention. They constitute principle schematic representations intended to facilitate the understanding of the invention and are not necessarily to the scale of practical applications.

In particular, the thicknesses and dimensions of the different layers and portions of the devices illustrated are not representative of reality.

DETAILED DESCRIPTION OF THE INVENTION

Before starting a detailed review of embodiments of the invention, it is reminded that the invention, according to the first aspect thereof comprises, in particular the optional features below, which could be used in association or alternatively:

According to an embodiment, the optocoupler comprises a plurality of output connections configured to deliver a plurality of output electrical signals. These electrical signals can be similar to one another. Alternatively, they can be different from one another.

According to an embodiment, the matrix of laser diodes emits a monochromatic light having a wavelength of between 600 nm and 1100 nm.

According to an embodiment, at least part of the photovoltaic cells of the at least one matrix of photovoltaic cells are silicon-based photovoltaic cells.

According to an embodiment, the matrix of laser diodes emits a monochromatic light having a wavelength of between 500 nm and 600 nm.

According to an embodiment, at least part of the photovoltaic cells of the at least one matrix of photovoltaic cells are gallium-based photovoltaic cells.

According to an embodiment, the at least one matrix of photovoltaic cells comprises a number of photovoltaic cells of between 4 and 100.

According to an embodiment, the matrix of laser diodes comprises a number of laser diodes, less than or equal to the number of photovoltaic cells of the at least one matrix of photovoltaic cells.

According to an embodiment, the matrix of photovoltaic cells and the matrix of laser diodes are arranged facing one another.

According to an embodiment, the number of laser diodes is equal to the number of photovoltaic cells and each photovoltaic cell of the matrix of photovoltaic cells is arranged facing a corresponding laser diode of the matrix of laser diodes, as indicated above. Thus, each laser diode is associated with one single photovoltaic cell, and conversely. Pairs, each associating a laser diode with a photovoltaic cell, face-to-face, are thus formed.

According to an embodiment, the matrix of laser diodes comprises vertical-cavity surface-emitting laser (VCSEL) diodes.

According to an embodiment, the optocoupler comprises a plurality of matrices of photovoltaic cells, said plurality of matrices of photovoltaic cells being configured to deliver, as an output, a plurality of electrical output signals.

According to an embodiment, the matrix of laser diodes is configured to deliver the light signal, sent to the plurality of matrices of photovoltaic cells.

According to an embodiment, the laser source is separated from the at least one matrix of photovoltaic cells by a layer made of a material transparent to an emission wavelength of the laser diodes of the matrix of laser diodes.

According to an embodiment, the at least one output electrical signal is delivered at three output connections arranged so as to form a middle point connection.

According to an embodiment, the optocoupler comprises a housing inside which is integrated the at least one light source and the at least one matrix of photovoltaic cells.

According to an embodiment, the housing is configured to be reported on an electronic board.

The invention, according to the second aspect thereof, in particular comprises the optional features below, which could be used in association or alternatively:

According to an embodiment, the support is a connection gate.

According to an embodiment, the system further comprises an electronic circuit for driving an inverter branch, said electronic circuit being connected to at least one optocoupler.

According to an embodiment, the system further comprises an electronic circuit for driving an inverter branch, said electronic circuit having an input connected to at least one first optocoupler, and an output connected to at least one second optocoupler, wherein said at least first and second optocouplers, the electronic circuit and the support are situated in the housing.

According to an embodiment, said at least first and second optocouplers and the electronic circuit are reported on one same chip.

According to an embodiment, the electronic circuit is a circuit for driving an inverter branch.

According to an embodiment, the driver has a supply input connected to an output of the optocoupler, said optocoupler being connected at the input to an electrical supply.

According to an embodiment, the driver has a control input connected to an output of the optocoupler, said optocoupler being connected as an input to a controller.

According to an embodiment, the driver has a first output connected to an input of a first optocoupler, said first optocoupler being connected as an output to a first transistor of an inverter branch, and wherein the driver has a second output connected to an input of a second optocoupler, said second optocoupler being connected as an output to a second transistor of said inverter branch.

It is specified that, in the scope of the present invention, the deposition of a first layer on a second layer, does not compulsorily mean that the two layers are directly in contact with one another, but means that the first layer covers at least partially the second layer by being either directly in contact with it, or by being separated from it by at least one other layer or at least one other element.

Moreover, the relative arrangement of a first layer on a second layer, or of a third layer inserted between a first layer and a second layer, does not compulsorily mean that the layers are directly in contact with one another, but means that these layers are either directly in contact with one another, or separated from them by at least one other layer or at least one other element.

A substrate, a device, a layer, "based" on material A means a substrate, a device, a layer comprising this material A only, or this material A and possibly other materials, for example alloy elements, impurities or doping elements, the material A having advantageous properties for the substrate, the device, or the layer. Thus, a gallium Ga-based photovoltaic cell can comprise an InGaP-, or GaAs-, or InGaAs- active portion, for example.

In the present patent application, a doping referenced P comprises all the doping by positive load carriers, whatever the doping content. Thus, a doping P comprises doping P+ contents and doping P contents, less than the P+ type doping. Likewise, a doping referenced N comprises all the doping by negative load carriers, whatever the doping content. Thus, a doping N comprises doping N+ contents and doping N contents less than the N+ type doping.

By "matrix", this means a table in the form of lines and columns. For example, a matrix can comprise a plurality of lines and a plurality of columns, or one single line and a plurality of columns or also a plurality of lines and one single column. Preferably, in the scope of the present invention, a matrix comprises several lines and several columns.

In the present patent application, a laser or a laser diode produces a light beam spatially and temporally consistent. Such a light beam has a great spectral purity and can advantageously transmit different light signals. Typically, the spectral width of the laser beam is less than or equal to 2 nm.

According to the invention, a first embodiment of the optocoupler will now be described in reference to FIGS. 1, 2A, 2B.

The optocoupler 1 is preferably presented in the form of a stack of components 2, 3 produced or assembled on a chip 6. These components comprise, in particular, a matrix of laser diodes 2 and a matrix of photovoltaic cells 3 rotated facing the laser matrix 2. The optocoupler 1 preferably comprises input connections 370 on the matrix of laser diodes 2.

The matrix of laser diodes 2 can be arranged on a transparent layer 230 itself arranged on the matrix of photovoltaic cells 3. Thus, the transparent layer 230 is inserted between the matrix of laser diodes 2 and the matrix of photovoltaic cells 3, preferably directly in contact with said matrices 2, 3. The transparent layer 230 therefore imposes a distance between these two matrices 2, 3.

According to a possibility, the optocoupler 1 possibly comprises other intermediate, transparent layers between the matrices 2, 3.

Connections 31, 32 and interconnections 300 between the photovoltaic cells of the matrix 3 can be achieved on and/or through the chip 6, so as to form output connections 371 of the optocoupler 1.

According to the embodiment illustrated in FIG. 1, the stack thus comprises successively the following elements: the chip 6, the matrix of photovoltaic cells 3, the transparent layer 230, the matrix of laser diodes 2.

This stack is preferably vertical.

According to a preferred possibility, this stack is housed in a casing 4.

The matrix of laser diodes 2 and the matrix of photovoltaic cells 3 form at least partially one conversion system comprising a first conversion stage configured to achieve a first conversion of an input electrical signal into a light signal, and a second conversion stage configured to achieve a second conversion of the light signal into an output electrical signal.

Thus, the matrix of laser diodes 2 can be considered as an emitter and the matrix of photovoltaic cells 3 can be considered as a receiver for this emitter.

The first conversion is achieved at the level of the matrix of laser diodes 2.

An input electrical signal can be transmitted by way of two input connections 370 to the laser diodes of the matrix 2 connected together. These diodes can be connected in series or in parallel, preferably in parallel such that the voltage of the input signal is sufficiently low.

The laser diodes are configured to emit, from the input electrical signal, the light signal, preferably at a determined emission wavelength.

There can be four laser diodes of the matrix 2, for example arranged according to a 2×2 square, or more, for example, sixteen, according to a 4×4 square, for example, eighty-one, according to a 9×9 square, even more.

According to another possibility, the laser diodes of the matrix 2 can remain fixed to the substrate, on which they have been produced.

The laser diodes of the matrix 2 can be formed on the basis of In or on the basis of Ga, for example on the basis of InGaP, for an emission wavelength of around 635 nm, on the basis of AlGaAs for an emission wavelength of around 800 nm, or on the basis of InGaAs for an emission wavelength of around 1000 nm.

The laser diodes of the matrix 2 can be of the vertical-cavity surface-emitting laser (VCSEL) type, i.e. with a vertical cavity emitting through the surface.

These laser diodes can be monolithic.

Such a VCSEL configuration, well-known to a person skilled in the art, advantageously makes it possible to simplify the production of the matrix 2.

The emission of the laser diodes can be achieved from a surface rotated facing the matrix of photovoltaic cells 3.

This surface can be a lower face 21 of the first conversion stage after formation and/or returning of the matrix 2 on the matrix 3.

This first conversion can advantageously make it possible to obtain a high-power light signal.

Subsequently, an input electrical signal intended to electrically supply a driver can be advantageously converted into a high-power light signal.

This first conversion can have a conversion efficiency of around 60% to 70%, for example around equal to 66%.

The second conversion is achieved at the level of the matrix of photovoltaic cells 3.

The photovoltaic cells are configured to receive the light signal.

According to an embodiment, the matrix of laser diodes 2 extends along a first plane. The matrix of photovoltaic cells extends along a second plane. The first and second planes are parallel and arranged at a distance from one another.

According to an alternative embodiment, the matrix of laser diodes 2 and the matrix of photovoltaic cells 3 extend along curved surfaces facing one another.

According to a non-limiting embodiment, the matrix of laser diodes 2 and/or the matrix of photovoltaic cells 3 comprises several lines and several columns.

There can be four photovoltaic cells of the matrix 3, for example arranged according to a 2×2 square, or more, for example sixteen, according to a 4×4 square, for example eighty-one, according to a 9×9 square, even more.

According to an embodiment, a photovoltaic cell, preferably one single photovoltaic cell, each laser diode is situated opposite. According to an embodiment, which can possibly be combined with the preceding one, a laser diode, preferably one laser diode, each photovoltaic cell is situated opposite. According to a possibility, a photovoltaic cell of the matrix 3 corresponds to a laser diode of the matrix 2.

The photovoltaic cells of the matrix 3 can be formed on the basis of silicon or on the basis of Ga, for example on the basis of InGaP, on the basis of GaAs, or on the basis of InGaAs according to the emission wavelength of the laser diodes of the matrix 2.

The photovoltaic cells of the matrix 3 can be achieved according to the method described in document U.S. Pat. No. 9,647,161. It will be noted, that in this document, the photovoltaic cells are used to supply the integrated electronic circuit. In this document, the photovoltaic cells have no function at all in forming a portion of an optocoupler. All the more so, this document does not consider at all, that the photovoltaic cells form a portion of an insulation of a driver of a converter.

According to the method described in this document U.S. Pat. No. 9,647,161, the photovoltaic cells can be produced from a silicon-on-insulator (SOI)-type stack, comprising a substrate 6 surmounted by an insulating layer 61 and by a semi-conductive layer.

This semi-conductive layer is preferably "P"-type doped.

An ionic implantation on the surface of this semi-conductive layer can be achieved so as to obtain an upper portion having an "N"-type doping. A continuous interface of PN connection-type is thus created between the upper portion and a lower portion underlying the semi-conductive layer.

A lithographic step and a step of etching the semi-conductive layer then make it possible to preferably form islands, separated and insulated from one another, each comprising a superposition of the lower and upper portions of the semi-conductive layer. Upper and lower metal contacts can be respectively deposited on the upper and lower portions of each island.

Subsequently, each island forms a photovoltaic cell having a front face formed by the upper portion.

These photovoltaic cells can be connected together so as to form a matrix of photovoltaic cells. In particular, the upper contact of a photovoltaic cell can be connected at the lower contact of an adjacent photovoltaic cell, so as to connect the photovoltaic cells of the matrix 3 in series.

According to an embodiment illustrated in FIG. 1, the connection between the photovoltaic cells of the matrix 3 can be achieved by way of through vias 600 formed through the substrate 6.

The photovoltaic cells are subsequently interconnected by the rear face 62. The advantage of this embodiment is, in particular, that it makes it possible to remove a shadow from the photovoltaic cells due to contacts on the front face.

To form through vias 600, a deep etching can be achieved from the rear face 62 so as to form openings under the base of the islands.

Each island is preferably associated with at least two openings, possibly ten, preferably eight.

An insulator can be deposited, then etched anisotropically so as to line the vertical edges of the openings.

Then, an implantation can be achieved by the rear face on one half of the openings, in order to dope, of N+ type, the first zones 31 of the lower portion of the semi-conductive layer. Each island is thus associated with an opening extending by an N type implantation.

A second implantation can be achieved similarly on the other half of the openings in order to dope, of P+ type, second zones 32 of the lower portion of the semi-conductive layer. Each island is thus associated with an opening extending by an implantation of P type.

The openings can then be filled with a conductive material by the rear face, in order to form through vias of "TSV last" type.

The formation of interconnections 300 on the rear face 62, for example, by a "lift-off" technique, or by lithography and etching, makes it possible to connect the through vias 600 together.

In the scope of the present patent application, other embodiments of photovoltaic cells can be considered, in particular the embodiments described in U.S. Pat. No. 9,647,161.

Other configurations of matrices of photovoltaic cells 3, well known to a person skilled in the art, can also be used and integrated in the optocoupler 1.

The reception of the light signal by the photovoltaic cells can be achieved from a surface rotated facing the matrix of laser diodes 2.

This surface can be an upper surface 33 of the second conversion stage after formation and/or returning of the matrix 2 on the matrix 3.

According to a preferred embodiment, the photovoltaic cells are preferably formed or returned on the front face of the chip 6. They can be separated from one another and partially insulated from one another by way of a superficial oxide layer 61, for example.

The photovoltaic cells are preferably connected to one another in series and can deliver the output electrical signal by way of two output connections 371. This configuration is illustrated in FIG. 1.

Two adjacent photovoltaic cells can be interconnected by way of interconnexions 300 connecting the first zone of N type 31 of one of the two photovoltaic cells adjacent to the second zone of P type 32 of the other of the two adjacent photovoltaic cells.

These interconnections 300 can be achieved in the rear face of the chip 6 by way of through vias 600 formed in the chip 6.

According to the non-limiting embodiment illustrated in FIG. 1, the rear face 62 of the chip 6 is fixed on a support 5. The front face of the chip supports the cells of the matrix of photovoltaic cells 3. Preferably, the matrix of photovoltaic cells 3 is arranged directly in contact with the insulating layer 61 of the chip 6.

The upper face 33 of the matrix of photovoltaic cells 3 is arranged preferably directly in contact with the lower face of the transparent layer 230. The upper face of the transparent layer 230 is arranged preferably directly in contact with the front face 21 of the matrix of laser diodes 2.

Figure 2A:
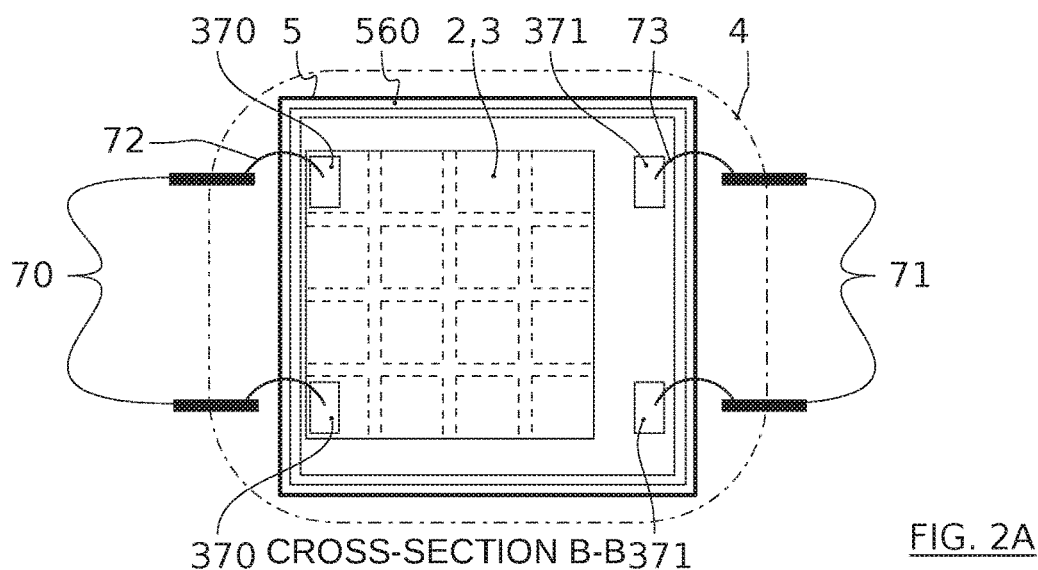
FIG. 2A shows a top view of the optocoupler system illustrated in FIG. 1.
Figure 2B:
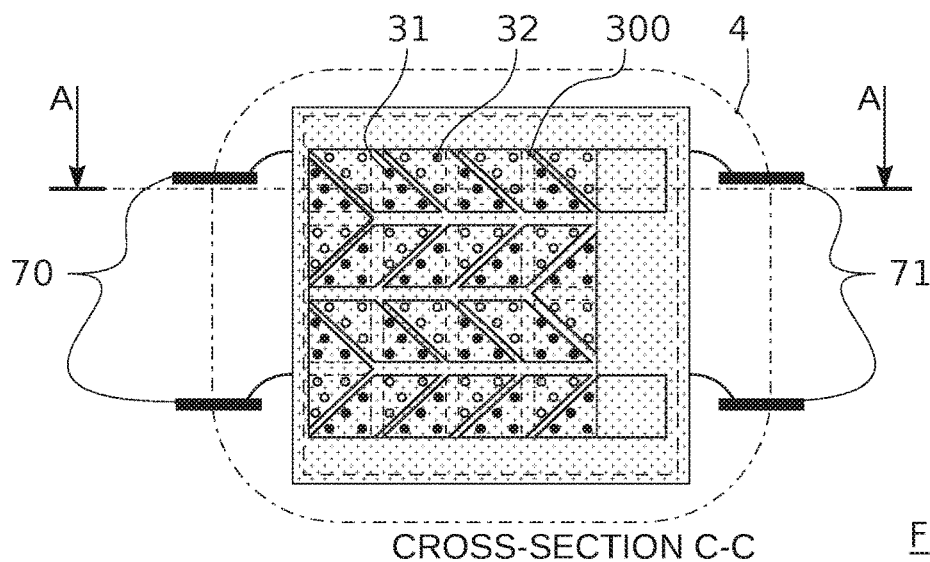
FIG. 2B shows a bottom view of the optocoupler system illustrated in FIG. 1.

As illustrated in FIG. 2B, a chevron pattern can, for example, make it possible to connect the N-type connections 31 to the P-type connections 32 of two adjacent photovoltaic cells.

This second conversion makes it possible to obtain an output electrical signal at the level of the output connections 371.

According to a possibility illustrated in FIG. 2A, there can be two output connections 371.

Figure 2C:
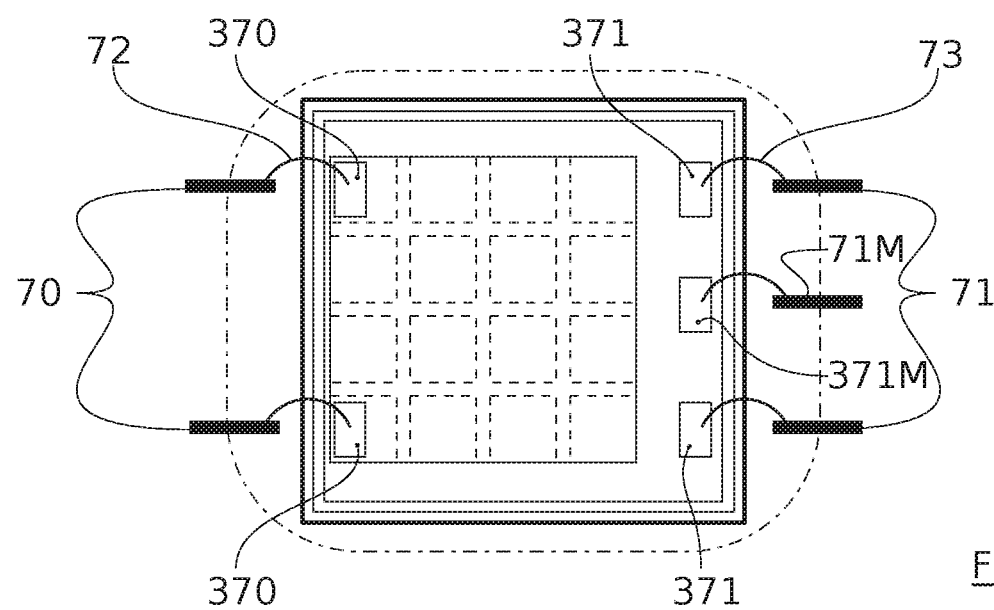
FIG. 2C shows a top view of an optocoupler system according to a second embodiment of the present invention.

As illustrated in FIG. 2C, according to another possibility, there can be three output connections 371, 371M. In this case, the third output connection 371M corresponds preferably to a middle point, i.e., a point situated between the first and second connections 371.

This possibility makes it possible to deliver an output electrical signal varying between two opposite voltage values on each of the output connections 371, with respect to a reference voltage on the third output connection 371M, to the ground or at 0V, for example.

According to a possibility, a first output connection 371 engages with a first number of photovoltaic cells and a second output connection 371 engages with a second number of photovoltaic cells different from the first number. This makes it possible to deliver first and second output electrical signals respectively on the first and second output connections 371, different from one another. In particular, these first and second output electrical signals can have voltages of opposite signs relative to the middle point, and different in absolute value.

According to another possibility, the number of output connections 371 other than that to middle point 371M is greater than 2. This number of output connections 371 other than that at middle point 371M can be greater than 3.

These output connections 371 can thus deliver a plurality of output signals having different positive and negative voltage values with respect to the middle point. These voltage values can be selected arbitrarily.

The second conversion can have a conversion efficiency of around 15% to 25%.

The conversion system can, in particular, comprise a transparent layer 230 of thickness of between a few hundred nanometres and a few micrometres. This thickness can advantageously be selected according to the wavelength of the laser diodes of the matrix 2, so as to optimise the optical coupling of the conversion system.

The transparent layer 230 can be, for example, a silicone or silicone/epoxy adhesive layer. Such an adhesive transparent layer 230 makes it possible to advantageously assemble and/or to fix the matrix of laser diodes 2 on the photovoltaic cells of the matrix 3.

The matrix of laser diodes 2 is preferably configured to directly illuminate the matrix of photovoltaic cells 3.

In particular, each laser diode of the matrix 2 can be sized and arranged so as to illuminate each corresponding photovoltaic cell of the matrix 3.

The total emission surface area can be less than or equal to the total reception surface area.

Figure 3A:
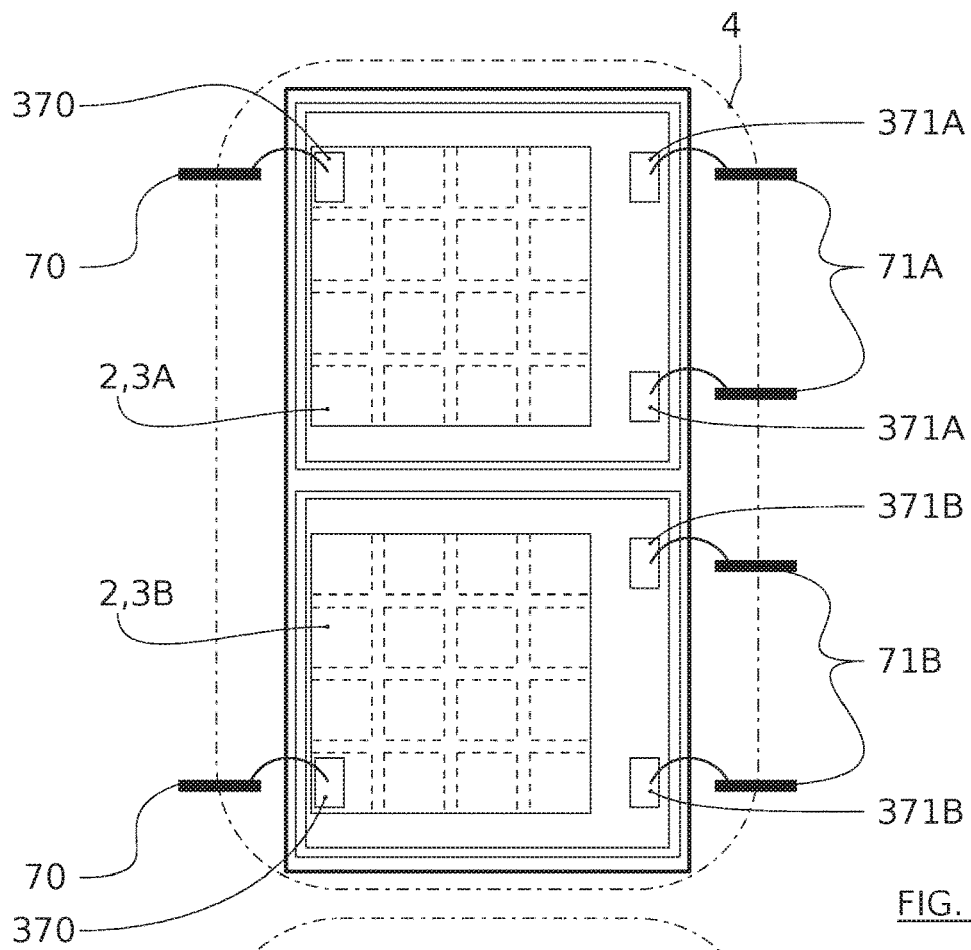
FIGS. 3A and 3B illustrate respectively a top view and a bottom view of an optocoupler system according to a third embodiment of the present invention.
Figure 3B:
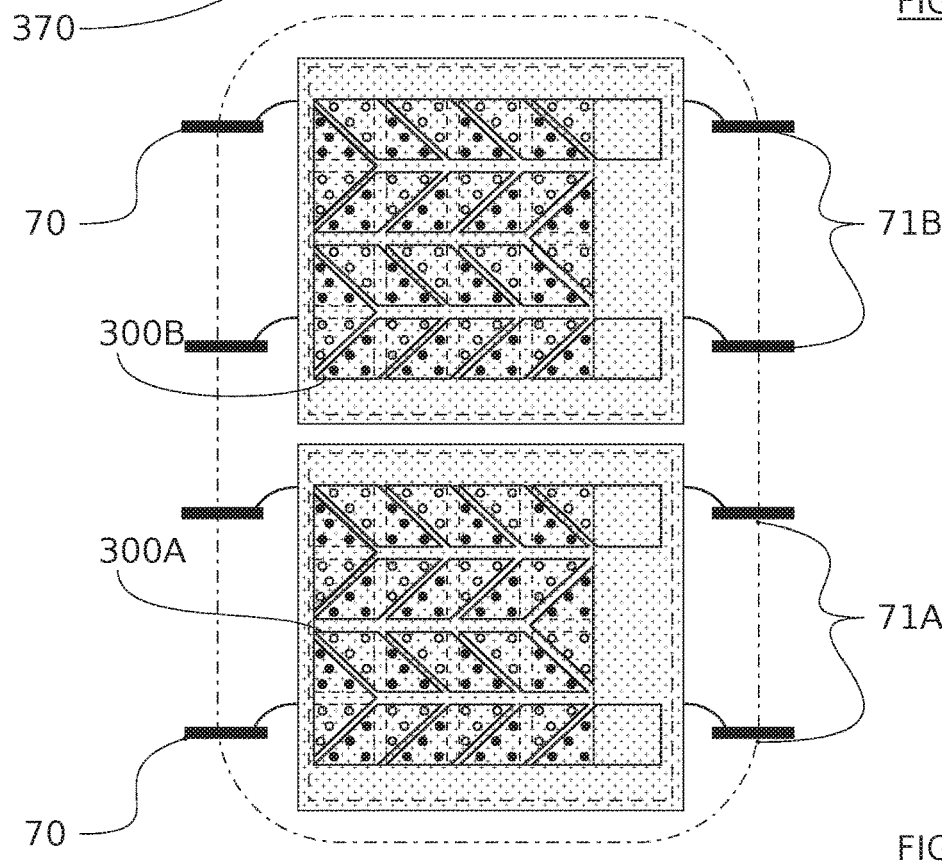

According to an alternative possibility illustrated in FIGS. 3A, 3B, two independent matrices of photovoltaic cells 3A, 3B can be coupled to one single matrix of laser diodes 2. In this case, the input electrical signal transmitted between the two input connections 370 can be advantageously split into two output electrical signals, respectively delivered between two output connections 371A and two output connections 371B, by way of two separate interconnection systems 300A, 300B. According to this possibility, the total emission surface area can be greater than the total reception surface area.

According to a preferred possibility, the optocoupler 1 therefore comprises the input connections 370 connected to the matrix of laser diodes 2 returned on and separated from at least one matrix of photovoltaic cells 3, 3A, 3B by the adhesive transparent layer 230. The at least one matrix of photovoltaic cells 3, 3A, 3B is formed on the chip 6. It is connected to the output connections 371, 371A, 371B by way of through vias and interconnections 300, 300A, 300B.

Such an optocoupler 1 can be assembled on a connection gate 5 by way of a fixing layer 560. This fixing layer 560 can be, for example, an epoxy glue or result from a soldering.

The optocoupler 1 fixed on the connection gate 5 can be assembled in a casing 4 partially passed through by pads or input pins 70 and output pins 71.

In particular, the input connections 370 can be connected to the input pins 70 by way of connection wires 72, such as illustrated in FIG. 1. As the case may be, the output connections 371, 371A, 371B, 371M can be connected to the output pins 71, 71A, 71B, 71M by way of connection wires 73.

The casing 4 surrounding the connection gate 5, the optocoupler 1 and the connection wires 72, 73 can be solid, of epoxy type, or with a cavity.

The input pins 70 and output pins 71, the casing 4 comprising the connection gate 5, the optocoupler 1 and the connection wires 72, 73 preferably form an optocoupler system.

This optocoupler system can subsequently form a base module which could be advantageously used to insulate different portions of a converter.

Figure 4:
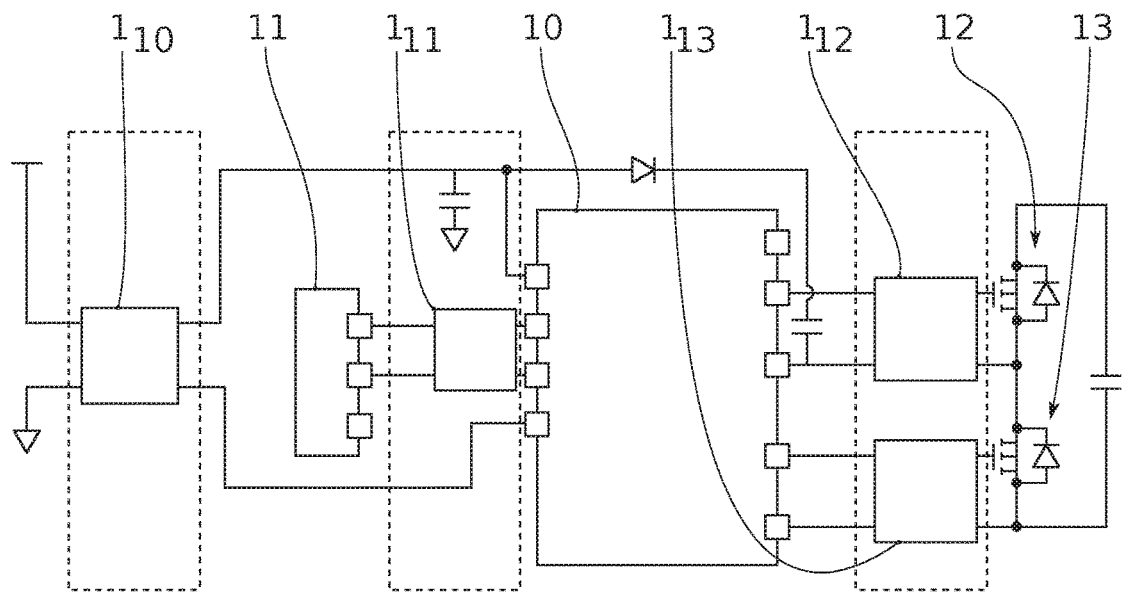
FIG. 4 shows a diagram of a power converter comprising at least one optocoupler according to an embodiment of the present invention.

Below, an example of using such a base module illustrated in FIG. 4 relates to the insulation of an inverter.

This example is not limiting and can be adapted *mutatis mutandis* to all types of converters such as, for example, a rectifier, a chopper, an AC/AC converter, a DC/DC converter. This list, however, is not exhaustive.

An inverter can comprise an inverter branch connected to a signal source to be converted, and an electronic circuit for driving 10 this inverter branch.

The inverter branch can be typically formed by two power transistors 12, 13.

The electronic driver, simply called driver 10, is supplied by an electrical supply and controlled by input signals, for example, of Pulse Width Modulation (PWM) type coming from a controller 11.

It drives each of the transistors 12, 13 of the inverter branch.

According to a possibility, a first optocoupler module $1_{10}$ can insulate the driver 10 from the electrical supply.

This first optocoupler module $1_{10}$ between an electrical supply supplying, for example, an electrical power of 6 W and a driver 10 requiring, for example, a supply of around 30V and 18 mA, can be sized as follows:

The matrix of laser diodes 2 connected to the electrical supply can supply a light power of around 4 W from the input electrical signal having an electrical power of 6 W (the first conversion has, for example, a conversion efficiency of around 66%).

Each of the photovoltaic cells of the matrix 3 can deliver around 0.4V under a light power of 4 W (the second conversion has, for example, a conversion efficiency of around 15%).

Subsequently, the matrix of photovoltaic cells 3 can comprise 81 photovoltaic cells so as to deliver, in total, 81×0.4V=32.4V and 19 mA for the output electrical signal. This output electrical signal can therefore advantageously electrically supply the driver 10.

According to a possibility, a second optocoupler module $1_{11}$ can insulate the driver 10 from the controller 11.

This second optocoupler module $1_{11}$ between a controller 11 supplying, for example, an electrical power of 0.5 W (10V to 50 mA) and a driver 10 requiring, for example, a PWM signal of between 0V and 5V under 15 μA, can be sized as follows:

The matrix of laser diodes 2 connected to the controller 11 can supply a light power of around 330 mW from the PWM signal delivered by the controller 11 of an electrical power of 0.5 W (the first conversion has, for example, a conversion efficiency of around 66%). This light power is broadly greater than the light power required (500 μW) to deliver an output electrical signal of between 0V and 5V under 15 μA, by considering a second conversion having, for example, a conversion efficiency of around 15%.

Each of these photovoltaic cells of the matrix 3 can indeed deliver around 0.3V under a light power of 500 μW.

Subsequently, the matrix of photovoltaic cells 3 can comprise 16 photovoltaic cells so as to deliver, in total, 16×0.3V=4.8V and 15 μA for the output electrical signal. This output electrical signal can therefore advantageously control the driver 10.

According to a possibility, third and fourth optocoupler modules $1_{12}$, $1_{13}$ can insulate the driver 10 from the transistors 12 and 13 of the inverter branch, respectively.

For a driver 10 which could deliver command signals of 56V and 100 mA (5.6 W), these third and fourth optocoupler modules $1_{12}$, $1_{13}$ can each be sized as follows:

The matrix of laser diodes 2 connected to the driver 10 can supply a light power of around 3.7 W from the command signal delivered by the driver 10 of an electrical power of 5.6 W (the first conversion has, for example, a conversion efficiency of around 66%).

Each of the photovoltaic cells of the matrix 3 can deliver around 0.4% V under a light power of 3.7 W (the second conversion has, for example, a conversion efficiency of around 15%).

Subsequently, the matrix of photovoltaic cells 3 can comprise 16 photovoltaic cells so as to deliver, in total, 16×0.4V=6V and 90 mA for the output electrical signal.

The output electrical signals of the third and fourth optocoupler modules $1_{12}$, $1_{13}$ can therefore advantageously drive the transistors 12, 13 of the inverter branch.

Naturally, for one same inverter, it can be provided to only have one single optocoupler from among the optocouplers $1_{10}$, $1_{11}$, $1_{12}$, $1_{13}$, or to have several of them, even to have all of them.

The optocoupler system can be associated with an integrated electronic circuit 10 to form an integrated module. According to a specific example, this integrated module can advantageously comprise different portions of a converter.

Below, a non-limiting example of such an integrated module relates to the insulation of the driver 10 of an inverter. However, the invention covers the cases wherein the integrated electronic circuit is not a driver.

Figure 5:
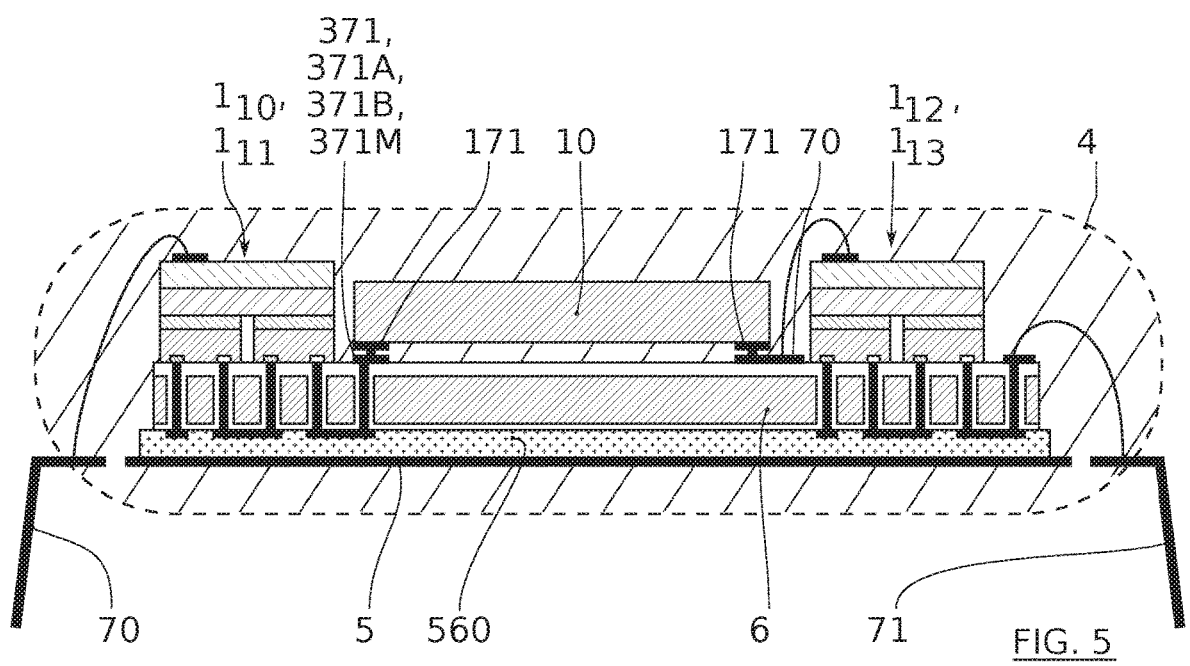
FIG. 5 shows, transversally cross-sectionally, an optocoupler system according to another embodiment of the present invention.

This module illustrated in FIG. 5 can, for example, comprise first and second optocouplers having the same insulation function as the first and second optocoupler modules $1_{10}$, $1_{11}$, and called, in short below, optocouplers $1_{10}$, $1_{11}$. This module can also comprise third and fourth optocouplers having the same insulation function as the third and fourth optocoupler modules $1_{12}$, $1_{13}$, and called, in short below, optocouplers $1_{12}$, $1_{13}$.

For example, the optocouplers $1_{10}$, $1_{11}$, $1_{12}$, $1_{13}$ can be produced and/or assembled on one same chip 6 by being insulated from one another. This chip 6 can be glued or welded on a support 5, preferably on a connection gate 5, and the driver 10 can be flipped and returned on the chip 6.

Various returning and connection techniques, well-known to a person skilled in the art and of common practice in the microelectronics industry can be used, in order to connect the driver 10 and the optocouplers $1_{10}$, $1_{11}$, $1_{12}$, $1_{13}$.

In particular, techniques called "flipchip" and "wire-bonding" can be implemented.

Advantageously, the driver 10 is produced independently of the optocouplers $1_{10}$, $1_{11}$, $1_{12}$, $1_{13}$ comprising the substrate 6. The driver 10 can be produced before, during or after, the production of the optocouplers $1_{10}$, $1_{11}$, $1_{12}$, $1_{13}$. It can be mechanically returned in a casing 4 comprising the optocouplers and electrically connected to the latter.

Typically, the driver 10 comprises contact pads 171. In the example illustrated in FIG. 5, the contact pads 171 supported by the driver 10 are, for example, metal pads or metal balls, for example made of indium or tin or copper, or copper alloy, silver and tin. They are, for example, capable of melting or adhering to the connections 371, 371A, 371B, 371M, 70 by re-melting.

The inputs of the driver 10 can subsequently be connected by way of the connection pads 171 at the level of the output connections 371, 371A, 371B, 371M of the optocouplers $1_{10}$, $1_{11}$, according to the type of optocoupler 1 selected.

The outputs of the driver 10 can subsequently be connected by way of connection pads 171 at the level of the input connections 70 of the optocouplers $1_{12}$, $1_{13}$.

Thus, a converter portion is obtained, comprising the driver 10 and the insulation by optocouplers $1_{10}$, $1_{11}$, $1_{12}$, $1_{13}$ simply and such that is can be reproduced, and without for all that, the production of the optocouplers not having been limited by the production of the driver 10.

The casing 4 surrounding the connection gate 5, the optocouplers $1_{10}, 1_{11}, 1_{12}, 1_{13}$ and the driver 10 can be solid, of epoxy type, or with a cavity (to favour the thermal dissipation of the power converter, for example).

The integration of the optocoupler comprising the photovoltaic cells of the matrix 3 with the integrated electronic circuit, for example the driver 10, can be achieved according to the methods described in document U.S. Pat. No. 9,647,161. It will be noted, that in this document, the photovoltaic cells are used to supply the integrated electronic circuit. In this document, the photovoltaic cells have no function at all of forming a portion of an optocoupler. All the more so, this document does not at all consider that the photovoltaic cells form a portion of an insulation of a driver of a converter.

As indicated in this document, after having produced the stack comprising the matrix of photovoltaic cells 3 and possibly the matrix of laser diodes 2 separately from the integrated electronic circuit 10, the integrated electronic circuit 10 is returned on the stack. During this returning, connection zones supported by the matrix of photovoltaic cells 3 are put into contact with the corresponding connection zones supported by the integrated electronic circuit 10.

According to an embodiment, this integration method comprises the following steps:

after the step of producing the matrix of photovoltaic cells 3, a cycle of connection steps is carried out, comprising at least the production of at least one receiving zone 371, 371A, 371B, 371M, 70 intended to electrically connect the photovoltaic cells with the integrated electronic circuit 10.

after the cycle of connection steps, a returning step is carried out, on the stack, of the integrated electronic circuit 10 produced beforehand. The returning step is carried out so as to electrically connect the at least one receiving zone 371, 371A, 3718, 371M, 70 with an electrical contact zone 171 supported by the integrated electronic circuit 10.

This embodiment, makes it possible to separately produce the photovoltaic device and the integrated circuit 10 then to assemble them without heavily making the production method complex. Producing the matrix of photovoltaic cells 3 is therefore not limited by the production of the integrated circuit 10. Thus, more efficient cells can be produced. In conventional solutions, the photovoltaic cells are produced by lithography of layers successively deposited on the integrated circuit, typically from a front face of the latter.

Figure 6:
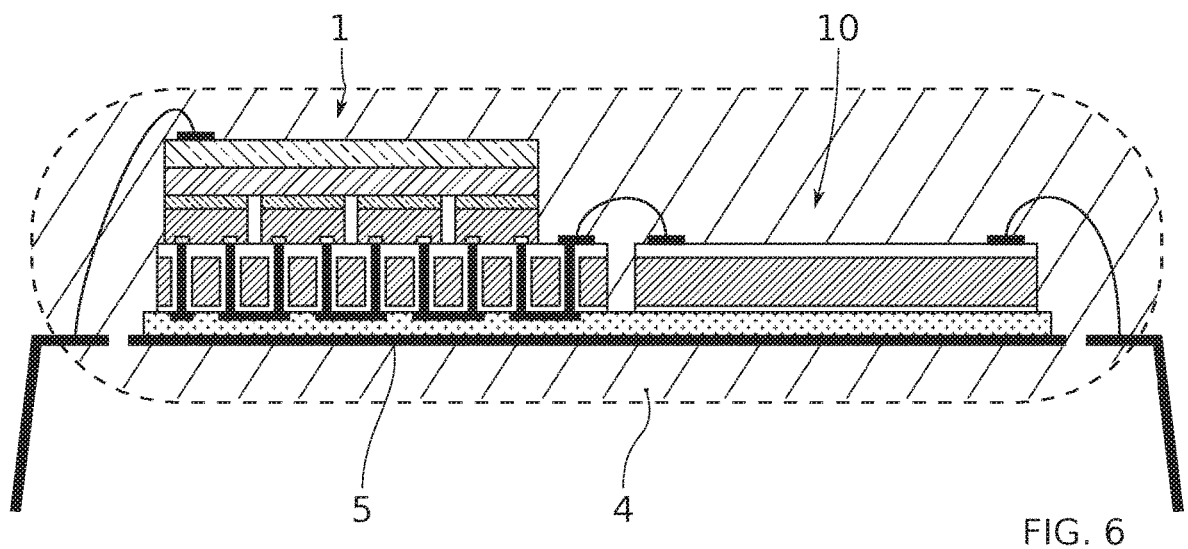
FIG. 6 shows, transversally cross-sectionally, an optocoupler system according to another embodiment of the present invention.

According to another example illustrated in FIG. 6, which module can only comprise one single optocoupler 1, for example so as to insulate the driver 10 only at the input. Other arrangements of the optocoupler(s) 1 can be naturally considered, for example, to insulate the driver 10 only at the output.

The invention is not limited to the embodiments described above and extends to all the embodiments covered by the claims.

The invention claimed is:

1. An optocoupler, comprising:
at least one light source and at least one receiver facing the at least one light source,
the at least one light source being configured to receive as an input an electrical input signal and to generate as an output, as a function of the electrical input signal, at least one light signal, sent to the at least one receiver, the at least one receiver being configured to receive at least part of the light signal as an input and to deliver, as an output, at least one electrical output signal at three output connections arranged so as to form a mid-point connection,
wherein the at least one light source is a matrix of laser diodes and the at least one receiver is a matrix of photovoltaic cells, the matrix of photovoltaic cells and the matrix of laser diodes extending mainly in parallel planes and being arranged facing one another, the parallel planes in turn being parallel to a plane of a surface of a substrate disposed under the matrix of photovoltaic cells.

2. The optocoupler according to claim 1, wherein the matrix of laser diodes emits a monochromatic light having a wavelength of between 600 nm and 1100 nm.

3. The optocoupler according to claim 1, wherein at least part of the photovoltaic cells of the at least one matrix of photovoltaic cells are silicon-based photovoltaic cells.

4. The optocoupler according to claim 1, wherein the matrix of laser diodes emits a monochromatic light having a wavelength of between 500 nm and 600 nm.

5. The optocoupler according to claim 1, wherein at least part of the photovoltaic cells of the at least one matrix of photovoltaic cells are gallium-based photovoltaic cells.

6. The optocoupler according to claim 1, wherein the at least one matrix of photovoltaic cells comprises a number of photovoltaic cells of between 4 and 100.

7. The optocoupler according to claim 1, wherein the matrix of laser diodes comprises a number of laser diodes less than or equal to the number of photovoltaic cells of the at least one matrix of photovoltaic cells.

8. The optocoupler according to claim 1, wherein the matrix of laser diodes comprises vertical-cavity surface-emitting laser (VCSEL) diodes.

9. The optocoupler according to claim 1,
further comprising a plurality of matrices of photovoltaic cells,
wherein the matrix of laser diodes is configured to deliver the light signal to the plurality of matrices of photovoltaic cells, the plurality of matrices of photovoltaic cells being configured to deliver, as an output, a plurality of electrical output signals.

10. The optocoupler according to claim 1, wherein the at least one light source is separated from the at least one matrix of photovoltaic cells by a layer made of a transparent material at an emission wavelength of the laser diodes of the matrix of laser diodes.

11. The optocoupler according to claim 1, further comprising a housing inside which is integrated the at least one light source and the at least one matrix of photovoltaic cells.

12. An optocoupler system, comprising:
a housing;
a support;
at least one chip assembled on the support; and
at least one first optocoupler according to claim 1 reported on the chip, the at least one first optocoupler, the at least one chip, and the support being disposed in the housing.

13. The system according to claim 12, further comprising an electronic circuit configured to drive an inverter branch, the electronic circuit being connected to the at least one optocoupler.

14. The system according to claim 12, further comprising an electronic circuit configured to drive an inverter branch, the electronic circuit comprising the at least one first optocoupler, and at least one second optocoupler, the electronic circuit having an input connected to the first optocoupler and an output connected to the second optocoupler, wherein the at least one first optocoupler and the at least one second optocoupler, the electronic circuit, and the support are disposed in the housing.

15. The system according to claim 14, wherein the at least one first optocoupler, the at least one second optocoupler, and the electronic circuit are reported on one same chip.

16. The system according to claim 15, wherein the electronic circuit is a driver of an inverter branch.

17. The system according to claim 16,
wherein the driver has a supply input connected to an output of the at least one first optocoupler or the at least one second optocoupler, and
wherein the at least one first optocoupler or the at least one second optocoupler is connected as an input to an electrical supply.

18. The system according to claim 16,
wherein the driver has a control input connected to an output of the at least one first optocoupler or the at least one second optocoupler, and
wherein the at least one first optocoupler or the at least one second optocoupler is connected as an input to a controller.

19. The system according to claim 16,
wherein the driver has a first output connected to an input of the at least one first optocoupler,
wherein the at least one first optocoupler is connected as an output to a first transistor of an inverter branch,
wherein the driver has a second output connected to an input of the at least one second optocoupler, and
wherein the at least one second optocoupler is connected as an output to a second transistor of the inverter branch.

20. An apparatus integrating a system according to claim 12, the apparatus being chosen from among:
switched-mode power supplies,
AC/AC, AC/DC, DC/DC converters,
isolated digital data transmission devices, and
load control devices.

* * * * *